(12) United States Patent
Zhang et al.

(10) Patent No.: US 10,056,414 B2
(45) Date of Patent: Aug. 21, 2018

(54) THIN FILM TRANSISTOR ARRAY SUBSTRATE HAVING BLACK MATRIX FORMED IN NON-DISPLAY ZONE AND COMMON ELECTRODE FORMED IN DISPLAY ZONE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Hongbo Zhang, Beijing (CN); Zhi Hou, Beijing (CN); Daeoh Oh, Beijing (CN); Ziheng Yang, Beijing (CN); Xianhao Chen, Beijing (CN); Qingqing Ma, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 272 days.

(21) Appl. No.: 14/355,344

(22) PCT Filed: Apr. 24, 2013

(86) PCT No.: PCT/CN2013/074629
§ 371 (c)(1),
(2) Date: Apr. 30, 2014

(87) PCT Pub. No.: WO2014/127579
PCT Pub. Date: Aug. 28, 2014

(65) Prior Publication Data
US 2016/0141314 A1     May 19, 2016

(30) Foreign Application Priority Data
Feb. 19, 2013     (CN) .......................... 2013 1 0053580

(51) Int. Cl.
*G02F 1/1362* (2006.01)
*H01L 27/12* (2006.01)
(Continued)

(52) U.S. Cl.
CPC ........ *H01L 27/1288* (2013.01); *G02F 1/1368* (2013.01); *G02F 1/133512* (2013.01);
(Continued)

(58) Field of Classification Search
CPC ............... H01L 27/3272; H01L 29/458; H01L 29/78618; H01L 29/78633; G02F 1/133512; G02F 1/136209
See application file for complete search history.

(56) References Cited

U.S. PATENT DOCUMENTS 5,821,622 A * 10/1998 Tsuji ..................... H01L 29/458
257/72
5,956,103 A * 9/1999 Ishiguro ............ G02F 1/136209
349/111
(Continued)

FOREIGN PATENT DOCUMENTS

| CN | 101232043 A | 7/2008 |
| CN | 102645799 A | 8/2012 |

OTHER PUBLICATIONS

International Preliminary Report on Patentability dated Aug. 25, 2015; PCT/CN2013/074629.
(Continued)

*Primary Examiner* — Anh Mai
(74) *Attorney, Agent, or Firm* — Ladas & Parry LLP

(57) ABSTRACT

A thin film transistor array substrate, a manufacturing method thereof and a display device are provided. The array substrate includes a substrate and a plurality of pixel units arranged on the substrate, each of which includes a display zone and a non-display zone including a thin film transistor
(Continued)

and a black matrix that are provided on the substrate, wherein the black matrix is disposed between the substrate and the thin film transistor.

8 Claims, 7 Drawing Sheets

(51) Int. Cl.
    *H01L 29/786*     (2006.01)
    *G02F 1/1335*     (2006.01)
    *G02F 1/1368*     (2006.01)
    *H01L 21/02*     (2006.01)
    *H01L 21/027*     (2006.01)
    *H01L 21/285*     (2006.01)
    *H01L 21/308*     (2006.01)
    *G09G 3/36*     (2006.01)

(52) U.S. Cl.
    CPC .. *G02F 1/133514* (2013.01); *G02F 1/136209* (2013.01); *H01L 21/0273* (2013.01); *H01L 21/02271* (2013.01); *H01L 21/2855* (2013.01); *H01L 21/28556* (2013.01); *H01L 21/3081* (2013.01); *H01L 27/124* (2013.01); *H01L 27/1214* (2013.01); *H01L 27/1218* (2013.01); *H01L 29/78633* (2013.01); *G02F 2001/13685* (2013.01); *G09G 3/36* (2013.01)

(56) References Cited

U.S. PATENT DOCUMENTS

| | | | |
|---|---|---|---|
| 7,042,024 B2* | 5/2006 | Yamazaki | H01L 29/66757 257/103 |
| 7,105,905 B2* | 9/2006 | Matsunaga | H01L 29/78633 257/435 |
| 7,816,682 B2* | 10/2010 | Kimura | G02F 1/134363 257/59 |
| 9,366,923 B2* | 6/2016 | Shen | G02F 1/136209 |
| 9,653,492 B2* | 5/2017 | Guo | H01L 27/1248 |
| 2003/0117059 A1 | 6/2003 | Koo et al. | |
| 2006/0102905 A1* | 5/2006 | Park | G02F 1/133512 257/72 |
| 2010/0012946 A1* | 1/2010 | Zhi | H01L 27/1288 257/72 |
| 2012/0249936 A1 | 10/2012 | Zi et al. | |

OTHER PUBLICATIONS

First Chinese Office Action Appln. No. 201310053580.6; dated Oct. 30, 2014.

International Search Report dated Nov. 28, 2013; PCT/CN2013/074629.

* cited by examiner

THIN FILM TRANSISTOR ARRAY SUBSTRATE HAVING BLACK MATRIX FORMED IN NON-DISPLAY ZONE AND COMMON ELECTRODE FORMED IN DISPLAY ZONE

TECHNICAL FIELD

The present disclosure relates to a thin film transistor array substrate, a manufacturing method thereof and a display device.

BACKGROUND

A multi-dimensional electric field type liquid crystal display is a kind of displays that has been widely used, and it generally includes two parts: a Thin Film Transistor (TFT) array substrate and a color filter substrate. A multi-dimensional electric field type liquid crystal display in which both pixel electrodes and common electrodes are formed on a thin film transistor array substrate has the characteristics of wide viewing angle and high opening ratio.

A thin film transistor array substrate is divided into a display zone and a non-display zone. In a thin film transistor structure in a conventional thin film transistor array substrate, as illustrated in FIG. 1, a gate electrode 12, an insulating layer 13, a semiconductor layer 14, a doped semiconductor layer 15, a source electrode 16, a drain electrode 17, a passivation layer 18 and a common electrode wire 19 are sequentially formed at a non-display zone on a substrate 11 from bottom to top, a common electrode 110, an insulating layer 13, a passivation layer 18 and a pixel electrode 111 are sequentially formed at a display zone B on the substrate 11 from bottom to top; and on the passivation layer 18 at the non-display zone A, there is provided a via hole C, through which the pixel electrode 111 is electrically connected to the drain electrode 17. When a FFS mode liquid crystal display operates, the pixel electrode 111 and the common electrode 110 are electrically conductive, and a horizontal electric field is formed by them.

In the above thin film transistor array substrate, the semiconductor layer is of a photosensitive material, and is susceptible to external light. A backlight source cannot be well sheltered by a thin film transistor in the array substrate and light tends to irradiate the semiconductor layer, resulting in a poor light-shielding processing of the bottom-gate, FFS mode thin film transistor array substrate. Thus, the display effect of the liquid crystal display is degraded.

SUMMARY

According to an embodiment of the present disclosure, there is provided a thin film transistor array substrate, comprising a substrate and a plurality of pixel units arranged on the substrate, each pixel unit including a display zone and a non-display zone, the non-display zone including a thin film transistor and a black matrix that are provided on the substrate, wherein the black matrix is disposed between the substrate and the thin film transistor.

In an example, the black matrix has an area larger than that of a semiconductor layer of the thin film transistor, and projection of the semiconductor layer on the substrate falls within projection of the black matrix on the substrate.

In an example, the thin film transistor is a top-gate thin film transistor, and has a semiconductor layer, source and drain electrodes, a gate insulating layer and a gate electrode that are sequentially provided therein in a light exiting direction of the array substrate.

In an example, within the non-display zone, between the substrate and the black matrix are sequentially formed a first conductive layer and a passivation layer in the light exiting direction, between the semiconductor layer and the source and drain electrodes is formed a doped semiconductor layer, and between the gate insulating layer and the gate electrode is formed a second conductive layer, in the display zone within the pixel unit, on the substrate are sequentially formed a pixel electrode, the passivation layer, the gate insulating layer and a common electrode in the light exiting direction.

In an example, a first via hole for exposing the drain electrode is provided in the gate insulating layer at the non-display zone, and a second via hole for exposing the pixel electrode is provided in the passivation layer and the gate insulating layer at the display zone, the thin film transistor array substrate further includes a third conductive layer that covers the first via hole, the second via hole and the gate insulating layer between the first via hole and the second via hole, so as to electrically connect the drain electrode and the pixel electrode.

In an example, the second conductive layer and the third conductive layer are tin-doped indium oxide thin films.

In an example, the array substrate further includes a data line electrically connected to a source electrode of the thin film transistor and a gate line electrically connected to a gate electrode of the thin film transistor, projection of the data line and the gate line on the substrate falling within projection of the black matrix on the substrate.

According to another embodiment of the present disclosure, there is provided a manufacturing method of a thin film transistor array substrate, comprising: forming a black matrix and a pixel electrode on a substrate, wherein the black matrix is located within a non-display zone of a defined pixel unit on the substrate, and the pixel electrode is located within a display zone of the defined pixel unit on the substrate; and forming a thin film transistor on the black matrix.

In an example, the method includes:

step (1), sequentially forming a first conductive material layer, a passivation material layer, a black matrix material layer, a semiconductor material layer, a doped semiconductor layer, a first metal material layer and a first patterned photoresist layer on the substrate; wherein the first patterned photoresist layer includes a first thickness zone, a second thickness zone, a third thickness zone and a fourth thickness zone, thicknesses of a photoresist in the first to fourth thickness zones are increased successively, and the first thickness zone covers the display zone, and the second to fourth thickness zones cover the non-display zone, and, the first thickness zone and the second to fourth thickness zones are separated from each other, so as to expose the first metal material layer therebetween, step (2), etching a portion not sheltered by the photoresist on the substrate subjected to step (1) until the substrate is exposed, so as to form a first structure at the non-display zone and a second structure at the display zone, which are separated from each other, and each of which has a first conductive layer, a passivation layer, a black matrix layer, a semiconductor layer, a doped semiconductor layer and a first metal layer laminated sequentially;

wherein, the black matrix layer in the first structure constitutes the black matrix, and the first conductive layer in the second structure constitutes the pixel electrode.

In an example, the method further includes:

step (3), conducting an ashing treatment on the first patterned photoresist layer, so as to remove the photoresist in the first thickness zone and form a second patterned photoresist layer for exposing the second structure; performing an etching on the exposed second structure, so as to remove the first metal layer, the doped semiconductor layer, the semiconductor layer and the black matrix layer in the second structure in sequence;

step (4), conducting an ashing treatment on the second patterned photoresist layer, so as to remove the photoresist in the second thickness zone and form a third patterned photoresist layer for exposing an edge portion of the first structure; performing an etching on the exposed edge portion until the black matrix is exposed, so as to form a third structure on the black matrix consisting of the patterned first metal layer, the patterned, doped semiconductor layer and the patterned semiconductor layer;

step (5), conducting an ashing treatment on the third patterned photoresist layer, so as to remove the photoresist in the third thickness zone and form a fourth patterned photoresist layer for exposing a middle part of the third structure; performing an etching on the exposed middle part until the patterned semiconductor layer in the third structure is exposed, so as to form a source electrode and a drain electrode;

step (6), removing the fourth patterned photoresist layer;

step (7), forming a gate insulating layer and a fifth patterned photoresist layer on the substrate subjected to step (6) in sequence, a partial region over the drain electrode and a partial region over the pixel electrode being exposed by the fifth patterned photoresist layer, respectively;

step (8), performing an etching on a portion not sheltered by the photoresist on the substrate subjected to step (7), so as to form a first via hole for exposing the drain electrode within the non-display zone, and to form a second via hole for exposing the pixel electrode within the display zone;

step (9), removing the fifth patterned photoresist layer;

step (10), forming a second conductive material layer, a second metal material layer and a sixth patterned photoresist layer that includes a fifth thickness zone and a sixth thickness zone on the substrate subjected to step (9) in sequence; the thickness of photoresist at the fifth thickness zone being larger than the thickness of photoresist at the sixth thickness zone, the fifth thickness zone covering a region where a gate electrode is to be formed, and the sixth thickness zone covering the first via hole, the second via hole and a region therebetween and a region where a common electrode is to be formed, step (11), performing an etching on a portion not sheltered by the photoresist on the substrate subjected to step (10) until the gate insulating layer is exposed, so as to form a gate electrode at the non-display zone, a fourth structure located between the first via hole and the second via hole and a fifth structure at the display zone; wherein, each of the gate electrode, the fourth structure and the fifth structure has a second conductive layer and a second metal layer laminated in sequence; and the semiconductor layer, the doped semiconductor layer, the source and drain electrodes, the gate insulating layer and the gate electrode that are located at the non-display zone and laminated in sequence constitute the thin film transistor.

In an example, the method further includes:

step (12), performing an ashing on the sixth patterned photoresist layer, so as to remove the photoresist in the sixth thickness zone and form a seventh patterned photoresist layer for merely sheltering the gate electrode, and conducting an etching on a portion not sheltered by the photoresist on the substrate, so as to remove the fourth structure and a second metal layer in the fifth structure, the second conductive layer at the display zone constituting a common electrode;

step (13), removing the seventh patterned photoresist layer.

In an example, the first metal material layer and the second metal material layer are formed by way of magnetron sputtering.

In an example, the first conductive material layer, the passivation material layer, the doped semiconductor material layer, the semiconductor material layer, the second conductive material layer and the gate insulating layer are formed by way of chemical vapor deposition.

According to still another embodiment of the present disclosure, there is provided a display device, comprising any of above-mentioned thin film transistor array substrates and a color filter substrate disposed in opposition to the array substrate, wherein, a black matrix is provided on the color filter substrate, and the black matrix on the color filter substrate is disposed at least in a region opposed to a region between a display zone of a pixel unit of the array substrate and a black matrix of the array substrate.

In the thin film transistor array substrate and the manufacturing method thereof provided by embodiments of the present disclosure, as there is a black matrix provided under the thin film transistor and the black matrix is disposed between the substrate and the thin film transistor, light that is emitted by the backlight source toward the semiconductor layer can be blocked out. Thus, an impact made by irradiation of light on the semiconductor layer is avoided, and the effect of light-shielding processing is enhanced. Thereby, the display effect of the liquid crystal display is improved.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

Figure 1:
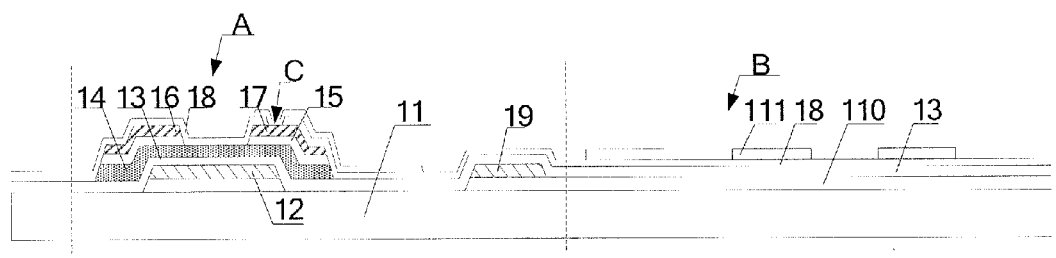
FIG. 1 is a schematically sectional view illustrating a conventional bottom-gate thin film transistor array substrate.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, all reasonable variants and modifications made by those ordinarily skilled in the art fall into the scope sought for protection by the invention.

According to an embodiment of the present disclosure, there is provided a thin film transistor array substrate. As illustrated in FIG. 2M, each pixel unit of the array substrate includes a non-display zone A and a display zone B (only one pixel unit is exemplarily illustrated in the figure, and the array substrate may include a plurality of pixel units arranged in the form of a two-dimensional matrix). A thin film transistor and a black matrix 21 disposed on a substrate 11 are included on the non-display zone A. For example, the thin film transistor is a top-gate thin film transistor, in which, a semiconductor layer 22, source and drain electrodes (24, 25), a gate insulating layer 26 and a gate electrode 27 are sequentially disposed in a light exiting direction of the array substrate. The black matrix 21 is disposed between the substrate 11 and the thin film transistor. The black matrix 21 acts to block out light that is emitted by a backlight source toward the semiconductor layer 22 of the thin film transistor.

In the thin film transistor array substrate provided by the embodiment of the present disclosure, as the black matrix is disposed under the thin film transistor, light that is emitted by the backlight source toward the semiconductor layer can be blocked out. Thus, an impact made by irradiation of light on the semiconductor layer is avoided, and the effect of light-shielding processing is enhanced. Thereby, the display effect of the liquid crystal display is improved.

As illustrated in FIG. 2M, in the thin film transistor array substrate described in the above embodiment, the black matrix 21 has an area larger than that of the semiconductor layer 22. For example, projection of the semiconductor layer 22 on the substrate 11 falls within projection of the black matrix 21 on the substrate. Therefore, it enables the black matrix 21 to guarantee that light of the backlight source does not enter the semiconductor layer 22 of the thin film transistor.

Certainly, it is a relatively preferred embodiment that the black matrix is made to be capable of blocking out light that enters the semiconductor layer completely. A case where only a part is sheltered, for example, only a part of a channel region of the semiconductor layer is sheltered, also has an effect of relieving the impact of light on the semiconductor layer, and this case falls within the protection scope of the invention as well.

As illustrated in FIG. 2M, in the thin film transistor array substrate described in the above embodiment, at the non-display zone A, a first conductive layer 28 and a passivation layer 29 may be sequentially formed between the substrate 11 and the black matrix 21 along the light exiting direction, a doped semiconductor layer 23 is formed between the semiconductor layer 22 and the source and drain electrodes (24, 25); and a second conductive layer 210 may be formed between the gate insulating layer 26 and the gate electrode 27. On the display zone B within a pixel unit, a pixel electrode 211, a passivation layer 29, a gate insulating layer 26 and a common electrode 212 may be sequentially formed on the substrate 11 along the light exiting direction; a first via hole 213 by which the drain electrode 25 is exposed may be provided on the gate insulating layer 26 at the non-display zone A; and a second via hole 214 by which the pixel electrode 211 is exposed may be provided on the passivation layer 29 and the gate insulating layer 26 at the display zone B.

Further, as illustrated in FIG. 2M, the thin film transistor array substrate may further include a third conductive layer 215, which covers the first via hole 213, the second via hole 214 and the gate insulating layer 26 between the first via hole 213 and the second via hole 214, so that the drain electrode 25 is electrically connected to the pixel electrode 211.

As illustrated in FIG. 2M, in the thin film transistor array substrate described in the above embodiment, material for the second conductive layer 210 and the third conductive layer 215 may be a tin-doped indium oxide thin film. The tin-doped indium oxide thin film is good in electrical conductivity. Of course, the second conductive layer 210 and the third conductive layer 215 may also be of other transparent electrode material.

For example, the first conductive layer 28 and the pixel electrode 211 at the above non-display zone are located in the same level, and it is possible that the same material is used for them and they are formed in the same patterning process.

According to an embodiment of the present disclosure, there is further provided a manufacturing method of a thin film transistor array substrate, which includes forming a black matrix on a substrate at a non-display zone within a pixel unit of the array substrate.

A top-gate thin film transistor is formed on the black matrix, and in a light exiting direction of the array substrate, the top-gate thin film transistor sequentially includes a semiconductor layer, source and drain electrodes, an insulating layer and a gate electrode; wherein the black matrix acts to block out light that is transmitted by the substrate and travels toward the semiconductor layer.

In the manufacturing method of the thin film transistor array substrate provided by the embodiment of the present disclosure, as the method is adopted to manufacture the above-mentioned thin film transistor array substrate, in which, the black matrix and the top-gate thin film transistor are provided, and the black matrix is disposed between the substrate and the semiconductor layer of the top-gate thin film transistor, light that is emitted by the backlight source toward the semiconductor layer can be blocked out. Thus, an impact made by irradiation of light on the semiconductor layer is avoided, and the effect of light-shielding processing is enhanced. Thereby, the display effect of the liquid crystal display is improved.

According to an embodiment of the present disclosure, there is further more provided a manufacturing method of a thin film transistor array substrate, which will be described in detail with reference to FIG. 2A to FIG. 2M.

Figure 2A:
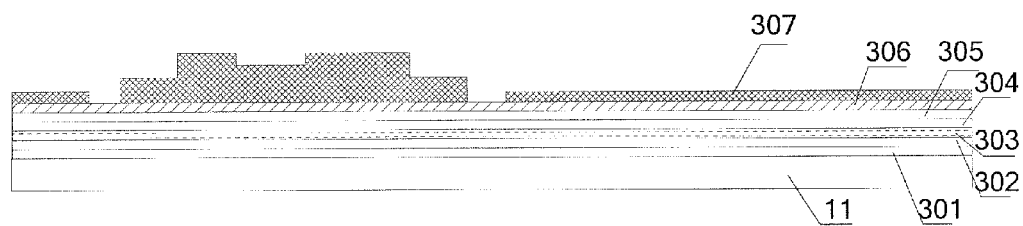
FIG. 2A to FIG. 2M are schematically sectional view illustrating the manufacturing procedure of a thin film transistor array substrate provided by an embodiment of the present disclosure.

Step 1, as illustrated in FIG. 2A, a first conductive material layer 301, a passivation material layer 302, a black matrix material layer 303, a semiconductor material layer 304, a doped semiconductor material layer 305, a first metal material layer 306 and a first patterned photoresist layer 307 are sequentially formed on a substrate 11.

For example, chemical vapor deposition or other film forming method is used to form the first conductive material layer 301 and the passivation material layer 302, the semiconductor material layer 304 and the doped semiconductor material layer 305, and the passivation material layer 302 may select an oxide, a nitride or an oxynitride, and may adopt other material as well. It is possible that the first metal material layer 306 is of molybdenum, antimony, aluminum, copper or other metal or an alloy, and is formed by using magnetron sputtering, thermal evaporation or other film forming method.

Further, the first patterned photoresist layer 307 is formed by a first patterning process with a mask, and other patterning process may also be adopted. The mask employed in the embodiment may be a grayscale mask, which has a transmissive zone, a non-transmissive zone, a semi-transmissive zone and a partially transmissive zone, and after a photoresist is exposed and developed with it, the photoresist is formed into the first patterned photoresist layer 307, which includes a first thickness zone, a second thickness zone, a third thickness zone and a fourth thickness zone. Thicknesses of the photoresist in the first to fourth thickness zones are increased successively, and the first thickness zone covers a display zone B, and the second to fourth thickness zones cover a non-display zone A. And, the first thickness zone and the second to fourth thickness zones are separated from each other, so as to expose the first metal material layer 306 therebetween. For example, the fourth thickness zone correspond to a region where source and drain electrode (24, 25) are to be formed, the third thickness zone corresponds to a region where a channel of a thin film transistor is to be formed, the second thickness zone corresponds to an edge region of a black matrix 21, the first thickness zone corresponds to a region where a pixel electrode is to be formed (namely, a display zone), and a zone that is not sheltered by the photoresist corresponds to a region between the display zone B and the non-display zone A. Furthermore, it is to be noted that, sum of the second to the fourth thickness zones corresponds to a region where the black matrix is to be formed. For example, it is possible that the photoresist is exposed and developed with a multi-tone mask, so as to form the above photoresist pattern having four thicknesses.

It is to be noted that, the above mode to form a TFT by adopting a multi-tone technology is merely an example of the invention, and the technical solution according to embodiments of the invention is not limited to the technology with the multi-tone mask. For example, it is also possible that a single-tone mask or a double-tone mask is used many times to perform a patterning process many times, so as to achieve the above structure.

In FIG. 2A, the first metal material layer 306 is partially sheltered by the photoresist, and its other part is not sheltered by the photoresist (the photoresist in which is removed after development).

Figure 2B:
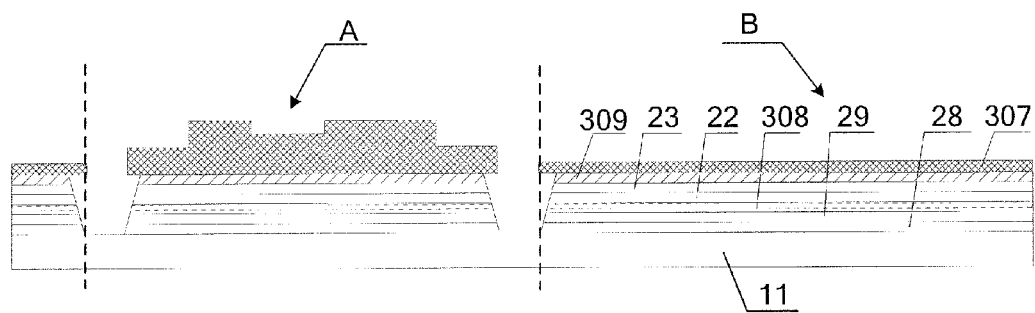

Step 2, as illustrated in FIG. 2B, the portion not sheltered by the photoresist on the substrate 11 subjected to step 1 is etched, until the substrate is exposed, so as to form a first structure at the non-display zone A and a second structure at the display zone B. The first structure and the second structure are separated from each other, and each of them has a first conductive layer 28, a passivation layer 29, a black matrix layer 308, a semiconductor layer 22, a doped semiconductor layer 23 and a first metal layer 309 that are laminated sequentially; wherein, the black matrix layer 308 in the first structure constitutes the black matrix 21, and the first conductive layer 28 in the second structure constitutes the pixel electrode 211.

For example, it is possible that the portion not sheltered by the photoresist on the substrate 11 is etched by way of wet or dry etch.

Figure 2C:
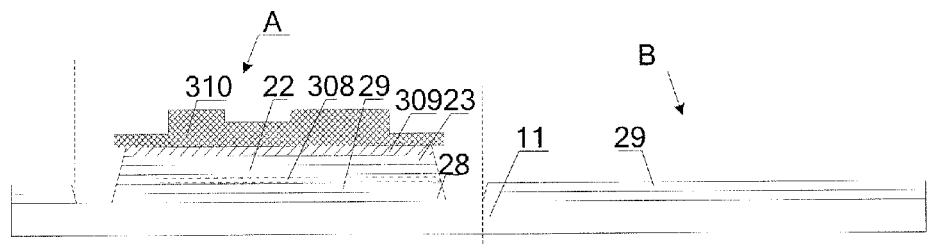

Step 3, an ashing treatment is conducted on the first patterned photoresist layer 307, as illustrated in FIG. 2C, to remove the photoresist in the first thickness zone and form a second patterned photoresist layer 310, thereby exposing the second structure; and the exposed second structure is etched, so as to remove the first metal layer 309, the doped semiconductor layer 23, the semiconductor layer 22 and the black matrix layer 308 in the second structure in sequence.

In the above method, ashing treatment is conducted on the first patterned photoresist layer 307 by using a plasma ashing process, and other ashing process may also be used for treatment. A wet or dry etch may be used for etch of the exposed second structure.

Figure 2D:
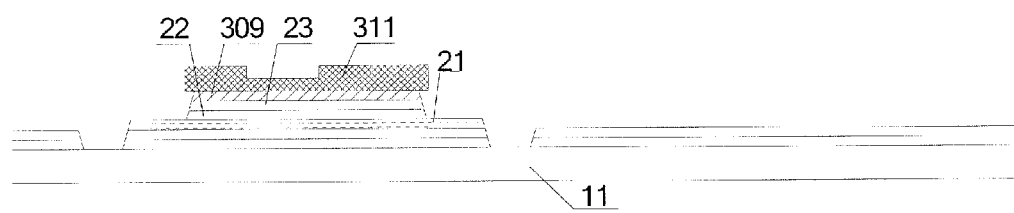

Step 4, an ashing treatment is conducted on the second patterned photoresist layer 310, as illustrated in FIG. 2D, to remove the photoresist in the second thickness zone and form a third patterned photoresist layer 311, thereby exposing an edge portion of the first structure; and the exposed edge portion is etched, until the black matrix 21 is exposed, so as to form a third structure on the black matrix 21, which consists of a patterned first metal layer 309, a patterned, doped semiconductor layer 23 and a patterned semiconductor layer 22.

In the above method, ashing treatment may be conducted on the second patterned photoresist layer 310 by using a plasma ashing process, and other ashing process may also be used for treatment. A wet or dry etch may be used for etch of the exposed edge portion.

Figure 2E:
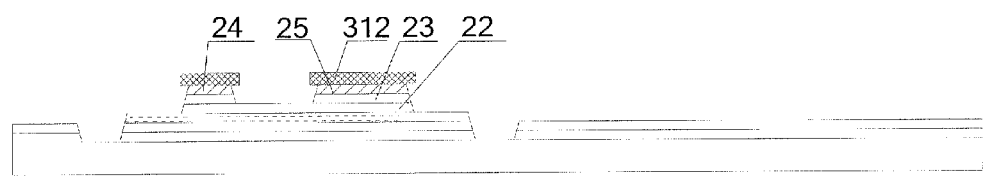

Step 5, an ashing treatment is conducted on the third patterned photoresist layer 311, as illustrated in FIG. 2E, to remove the photoresist in the third thickness zone and form a fourth patterned photoresist layer 312, so as to expose the middle part of the third structure; and the exposed middle part is etched, until the patterned semiconductor layer 22 in the third structure is exposed, so as to form a source electrode 24 and a drain electrode 25.

For example, ashing treatment may be conducted on the third patterned photoresist layer 311 by using a plasma ashing process, and other ashing process may also be used for treatment. A wet or dry etch may be used for etch of the exposed middle portion.

When the source electrode 24 is formed, a data line (not illustrated in the figure) can also be formed simultaneously.

Figure 2F:
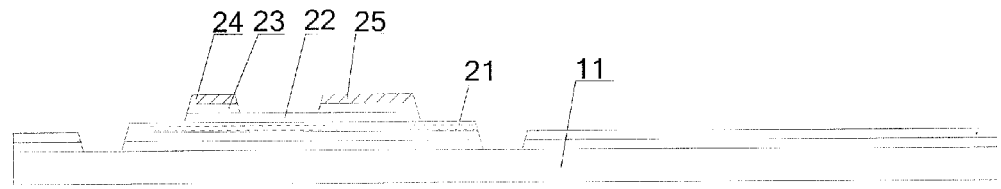

Step 6, as illustrated in FIG. 2F, the fourth patterned photoresist layer 312 is removed.

Figure 3:
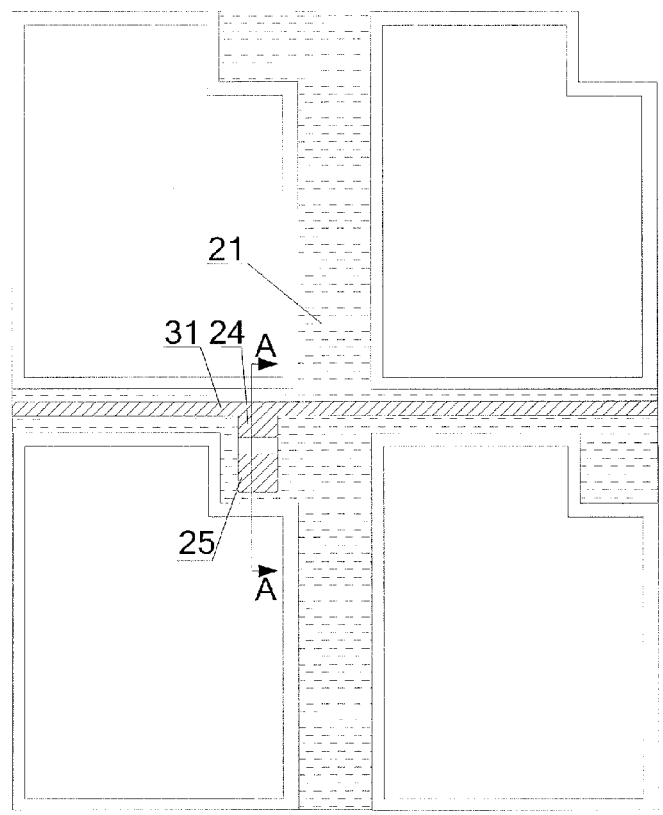
FIG. 3 is a plan view illustrating a thin film transistor array substrate provided by an embodiment of the present disclosure after a first patterning process.

FIG. 3 is a plan view illustrating a thin film transistor array substrate provided by an embodiment of the present disclosure after a first patterning process, and FIG. 2F is a cross-sectional view taken along A-A in FIG. 3. In FIG. 3, a data line 31 is included.

In the above method, agent stripping is used for stripping of the photoresist, and other stripping technology may also be used.

In addition, with respect to the bottom-gate thin film transistor in prior art illustrated in FIG. 1, a process to form the pixel electrode 211 is that, a layer of transparent conductive thin film is deposited on photoresist by using chemical vapor deposition or other film forming method, the transparent conductive thin film is patterned with a mask and is etched, so as to form the pixel electrode 211, and eventually, the photoresist is stripped off by using a Lift-off stripping technology. As the photoresist contacts with a patterned region of the transparent conductive thin film, the Lift-off stripping technology easily lead to incomplete stripping of the photoresist. Thus, a part of the photoresist is left over on the transparent conductive film, and display effect of the liquid crystal display is affected.

In the embodiment of the present disclosure, an agent stripping technology (stripping by using a stripping agent) is used for the photoresist so that the stripping effect of the photoresist is improved, and thus the display effect of the liquid crystal display can be improved.

Figure 2G:
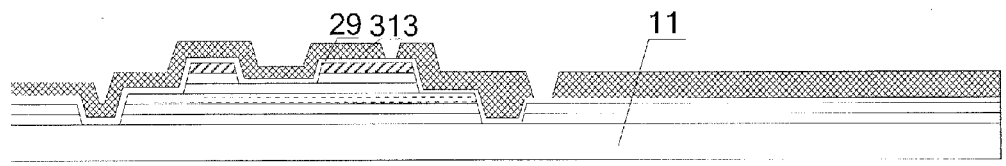

Step 7, as illustrated in FIG. 2G, a gate insulating layer 26 and a fifth patterned photoresist layer 313 are sequentially formed on the substrate 11 subjected to step 6.

Specifically, the gate insulating layer 26 may be formed on the substrate 11 by using chemical vapor deposition or other film forming method.

The fifth patterned photoresist layer 313 may be formed by a second patterning process with a mask, and may also be formed by using other patterning process. The mask in the embodiment of the present disclosure may be a common mask which includes a transmissive zone and a non-transmissive zone. After exposure and development are conducted on a photoresist, the fifth patterned photoresist layer 313 including a second fully-removed zone and a second fully-retained zone is formed. The second fully-removed zone corresponds to the region of a first via hole 213 and a second via hole 214, and the second fully-retained zone corresponds to other region.

In FIG. 2G, the gate insulating layer 26 is partially sheltered by the photoresist, and its other part is not sheltered by the photoresist (the photoresist in which is removed after development).

Figure 2H:
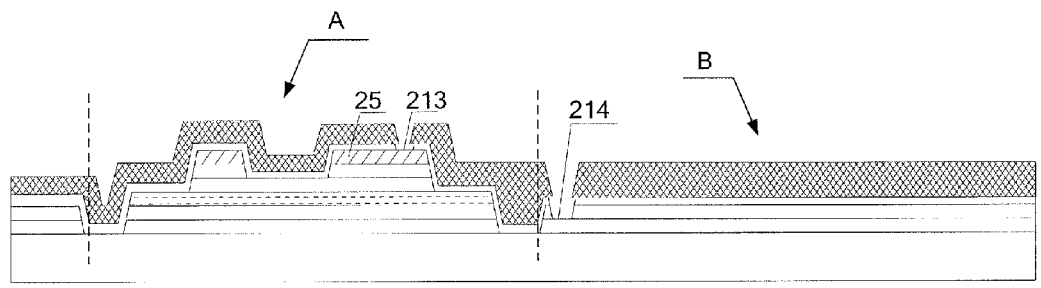

Step 8, as illustrated in FIG. 2H, the portion not sheltered by the photoresist on the substrate 11 subjected to step 7 is etched, so as to form the first via hole 213 by which a drain electrode 25 is exposed at the non-display zone A and a second via hole 214 by which the pixel electrode 211 is exposed at the display zone B.

In the above method, it is possible that the portion not sheltered by the photoresist on the substrate 11 is etched by way of wet or dry etch.

Figure 2I:
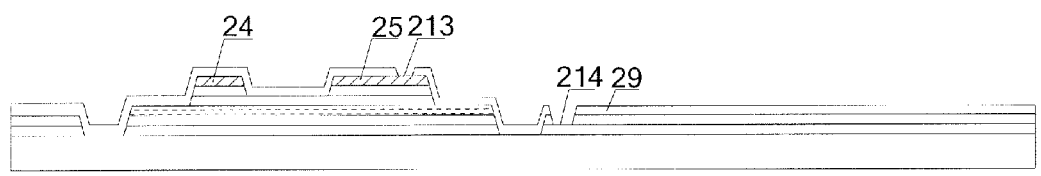
Figure 4:
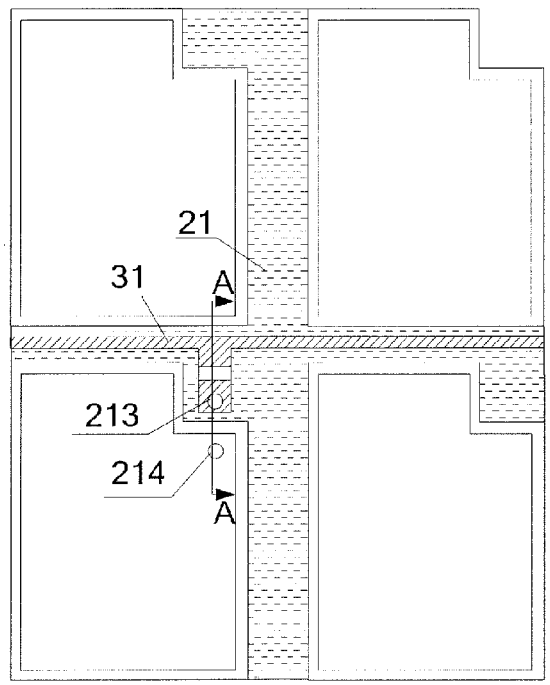
FIG. 4 is a plan view illustrating a thin film transistor array substrate provided by an embodiment of the present disclosure after a second patterning process.

Step 9, as illustrated in FIG. 2I, the fifth patterned photoresist layer 313 is removed. FIG. 4 is a plan view illustrating a thin film transistor array substrate provided by an embodiment of the present disclosure after a second patterning process, and FIG. 2I is a sectional view taken along A-A in FIG. 4.

An agent stripping technology may be used for removing of the fifth patterned photoresist layer 313. Certainly, other stripping technology may also be used for stripping of the photoresist.

Figure 2J:
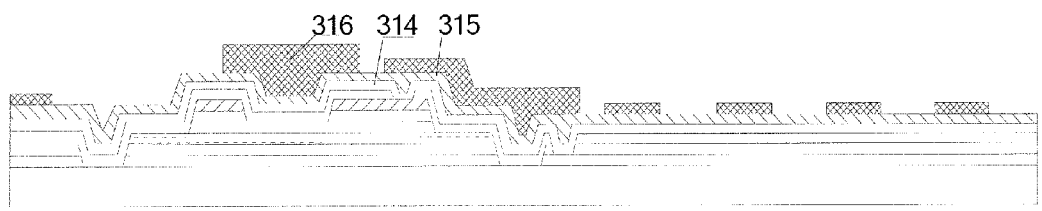

Step 10, as illustrated in FIG. 2J, a second conductive material layer 314, a second metal material layer 315 and a sixth patterned photoresist layer 316 are sequentially formed on the substrate 11 subjected to step 9.

In the above method, the second conductive material layer 314 may be formed by using chemical vapor deposition or other film forming method. The second metal material layer 315 may be of molybdenum, antimony, aluminum, copper or other metal or an alloy, and is formed by using magnetron sputtering, thermal evaporation or other film forming method.

Further, the sixth patterned photoresist layer 316 may be formed by a third patterning process with a mask, and other patterning process may also be adopted. The mask in the embodiment of the present disclosure may be a grayscale mask, and after a photoresist is exposed and developed, the sixth patterned photoresist layer 316 is formed. The sixth patterned photoresist layer 316 includes a third fully-retained zone (a fifth thickness zone), a third fully-removed zone and third partially-retained zones (sixth thickness zones). The third fully-retained zone corresponds to a region for a gate electrode 27 of a thin film transistor, the third partially-retained zones correspond to a region for a third conductive layer 215 and a region for a common electrode 212, respectively, and the third fully-removed zone corresponds to other region.

In FIG. 2J, the second metal material layer 315 is partially sheltered by the photoresist, and its other part is not sheltered by the photoresist (the photoresist in which is removed after development).

Figure 2K:
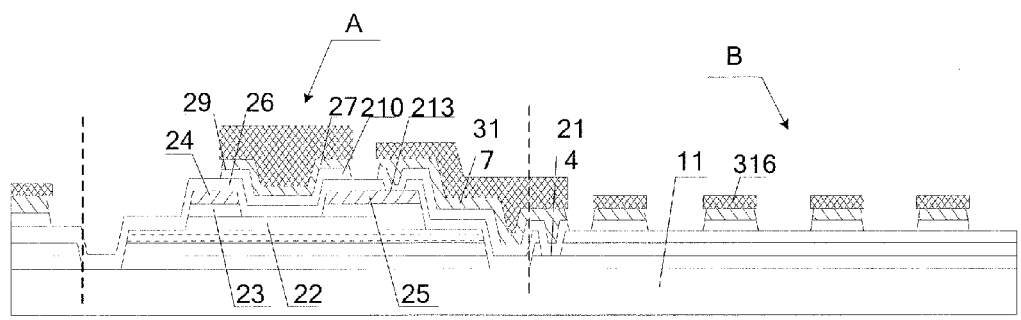

Step 11, as illustrated in FIG. 2K, the portion not sheltered by the photoresist on the substrate 11 subjected to step 10 is etched, until the gate insulating layer 26 is exposed, so as to form the gate electrode 27 at the non-display zone A, a fourth structure located between the first via hole 213 and the second via hole 214 and a fifth structure at the display zone B. Each of the gate electrode 27, the fourth structure and the fifth structure has a second conductive layer 210 and a second metal layer 317 that are laminated sequentially; and the semiconductor layer 22, the doped semiconductor layer 23, source and drain electrodes (24, 25), the gate insulating layer 26 and the gate electrode 27 that are located at the non-display zone A and laminated sequentially constitute a top-gate thin film transistor.

In the above method, it is possible that the portion not sheltered by the photoresist on the substrate 11 is etched by way of wet or dry etch. The gate electrode of the top-gate thin film transistor is placed on top, and can be subjected to a further optimization with an ashing process. For the top-gate thin film transistor, source and drain electrodes and the gate electrode are disposed at top of the semiconductor layer, and the source and drain electrodes and the gate electrode are metal material layers impervious to light, which can also block out external light, so as to serve a function of protecting the semiconductor layer.

Figure 2L:
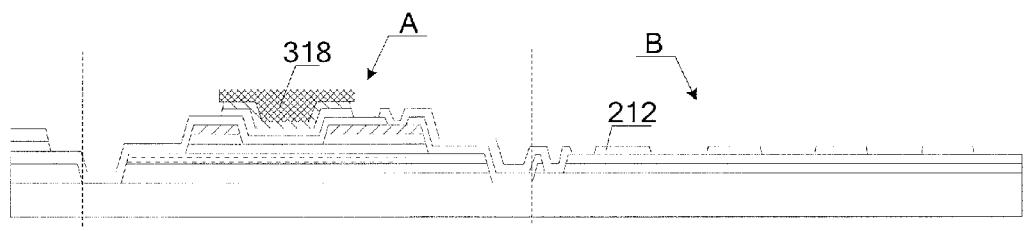
Figure 2M:
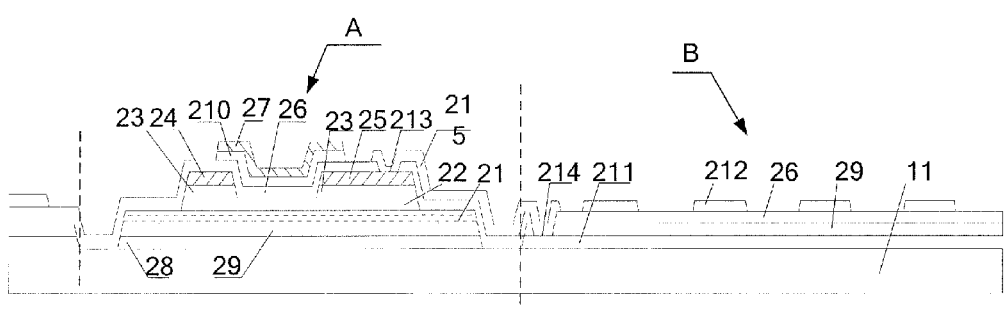

Step 12, an ashing is conducted on the sixth patterned photoresist layer 316, as illustrated in FIG. 2L, so as to remove the photoresist in the sixth thickness zones and form a seventh patterned photoresist layer 318 acting to only shelter the gate electrode 27, and the portion not sheltered by the photoresist on the substrate 11 is etched, so as to remove the second metal layer 317 in the fourth structure and the fifth structure. The second conductive layer 210 at the display zone B constitutes a common electrode 212.

For example, ashing may be conducted on the sixth patterned photoresist layer 316 by using a plasma ashing process, and other ashing process may also be used for treatment. The portion not sheltered by the photoresist on the substrate 11 may be etched by way of wet or dry etch.

The common electrode 212 is a common electrode having a plurality of gaps, so that a horizontal electric field is fainted between the common electrode 212 and the pixel electrode 211. Thus, arrangement status of liquid crystal molecules is changed.

In FIG. 2L, upon formation of the gate electrode 27, a gate line (not illustrated in the figure) can be formed simultaneously; and upon formation of the common electrode 212, a common electrode line (not illustrated in the figure) can be formed simultaneously.

Step 13, as illustrated in FIG. 2M, the seventh patterned photoresist layer 318 is removed.

Figure 5:
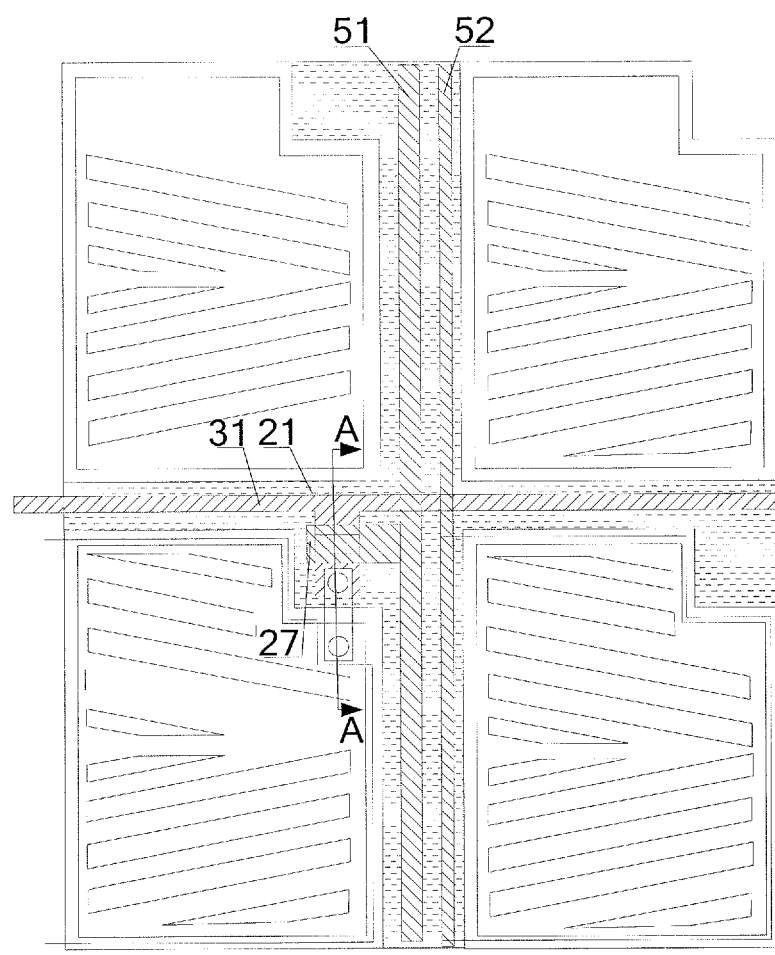
FIG. 5 is a plan view illustrating a thin film transistor array substrate provided by an embodiment of the present disclosure after a third patterning process.

FIG. 5 is a plan view illustrating a thin film transistor array substrate provided by an embodiment of the present disclosure after a third patterning process, and FIG. 2M is a sectional view taken along A-A in FIG. 5. In FIG. 5, a gate line 51 and a common electrode line 52 are included. Furthermore, as illustrated in FIG. 5, the data line 31 is electrically connected to a source electrode of a thin film transistor, the gate line 51 is electrically connected to a gate electrode of the thin film transistor, and projection of the data line 31 and the gate line 51 on a substrate 11 falls within projection of a black matrix 21 on the substrate 11. As such, as position of the black matrix coincides roughly with position of the thin film transistor as well as the gate line, the data line and other signal line, there will not be a too large impart on the opening ratio of the array substrate.

An agent stripping technology may be used for removing of the seventh patterned photoresist layer 318. Certainly, other stripping technology may also be used for stripping of the photoresist.

Figure 6:
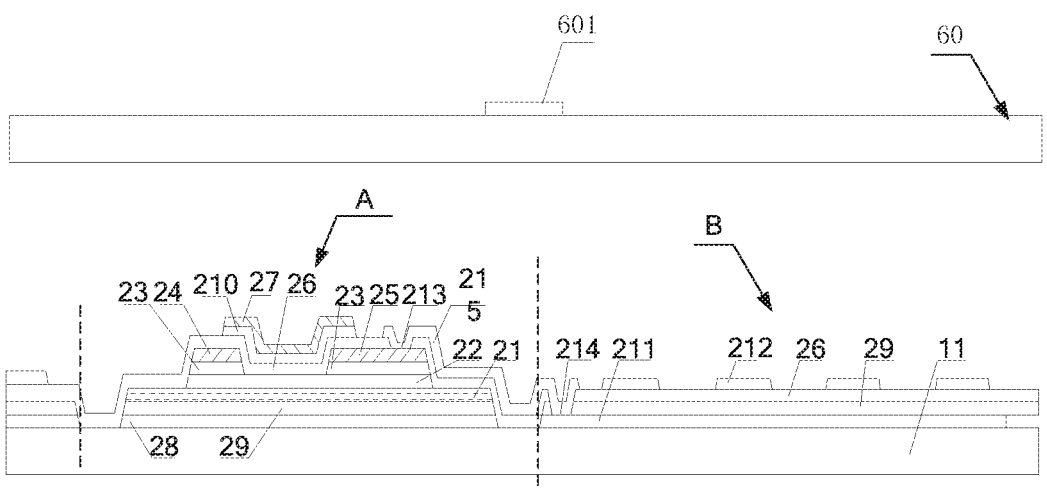
FIG. 6 is a plan view illustrating a display device provided by an embodiment of the present disclosure.

According to an embodiment of the present disclosure, there is further provided a display device, as illustrated in FIG. 6, the display device comprises the above thin film transistor array substrate and a color filter substrate 60 disposed in opposition to the array substrate, with a black matrix 601 provided on the color filter substrate 60; wherein, the black matrix 601 on the color filter substrate 60 is opposed at least to a region between a display zone B of a substrate 11 and a first conductive layer 28 (or a black matrix 308), so as to block out light from the region.

In the display device provided by the embodiment of the present disclosure, as it includes the thin film transistor array substrate described in the above embodiment, in which, under a thin film transistor there is provided a black matrix, and the black matrix is disposed between a substrate and a semiconductor layer of the thin film transistor, light that is emitted by a backlight source toward the semiconductor layer can be blocked out. Thus, an impact made by irradiation of light on the semiconductor layer is avoided, and the effect of light-shielding processing is enhanced. Thereby, the display effect of the liquid crystal display is improved.

In FIG. 2M, a portion not sheltered by a black matrix on a thin film transistor array substrate in a non-display zone A corresponds to a first black matrix on a color filter substrate in a direction perpendicular to the thin film transistor array substrate, and area of the first black matrix covers the portion not sheltered by the black matrix on the thin film transistor array substrate in the non-display zone A, so that the region of the non-display zone A is fully sheltered and covered by the black matrix on the thin film transistor array substrate along with the first matrix on the color filter substrate. Thus, an undesired phenomenon of light leakage of a backlight source or the like is avoided.

In addition, as compared with a case in prior art that a black matrix is wholly provided on a color filter substrate, in the present disclosure, most of a black matrix is provided on a thin film transistor array substrate, and a few parts of the black matrix is provided on a color filter substrate, so as to simplify the structure of the color filter substrate. In turn, the machining process of the color filter substrate is simplified.

Descriptions made above are merely exemplary embodiments of the invention, but are not used to limit the protection scope of the invention. The protection scope of the invention is determined by attached claims.

The invention claimed is:

1. A thin film transistor array substrate, comprising a substrate and a plurality of pixel units arranged on the substrate, each pixel unit including a display zone and a non-display zone, the non-display zone including a thin film transistor and a black matrix that are provided on the substrate,
    wherein the thin film transistor is a top-gate thin film transistor and has a semiconductor layer, the black matrix is disposed between the substrate and the semiconductor layer and is directly contacted with the semiconductor layer,
    wherein in the non-display zone, a first conductive layer is formed between the substrate and the black matrix, in the display zone, a pixel electrode is formed on the substrate, and
    both of the first conductive layer and the pixel electrode are directly disposed on a surface of the substrate, and formed from a same material through a same patterning process, and
    an orthographic projection of the first conductive layer on the surface of the substrate is not overlapped with an orthographic projection of the pixel electrode on the surface of the substrate.

2. The thin film transistor array substrate according to claim 1, wherein the black matrix has an area larger than that of a semiconductor layer of the thin film transistor, and projection of the semiconductor layer on the substrate falls within projection of the black matrix on the substrate.

3. The thin film transistor array substrate according to claim 1, wherein the thin film transistor has the semiconductor layer, source and drain electrodes, a gate insulating layer and a gate electrode that are sequentially provided therein in a light exiting direction of the array substrate.

4. The thin film transistor array substrate according to claim 3, wherein within the non-display zone, between the substrate and the black matrix are sequentially formed the first conductive layer and a passivation layer in the light exiting direction, between the semiconductor layer and the source and drain electrodes is formed a doped semiconductor layer, and between the gate insulating layer and the gate electrode is formed a second conductive layer,
    in the display zone within the pixel unit, on the substrate are sequentially formed the pixel electrode, the passivation layer, the gate insulating layer and a common electrode in the light exiting direction.

5. The thin film transistor array substrate according to claim 4, wherein,
    a first via hole for exposing the drain electrode is provided in the gate insulating layer at the non-display zone, and a second via hole for exposing the pixel electrode is provided in the passivation layer and the gate insulating layer at the display zone,
    the thin film transistor array substrate further includes a third conductive layer that covers the first via hole, the second via hole and the gate insulating layer between the first via hole and the second via hole, so as to electrically connect the drain electrode and the pixel electrode.

6. The thin film transistor array substrate according to claim 5, wherein, the second conductive layer and the third conductive layer are tin-doped indium oxide thin films.

7. The thin film transistor array substrate according to claim 3, further comprising a data line electrically connected to a source electrode of the thin film transistor and a gate line electrically connected to a gate electrode of the thin film transistor, projection of the data line and the gate line on the substrate falling within projection of the black matrix on the substrate.

8. A display device, comprising the thin film transistor array substrate according to claim 1 and a color filter substrate disposed in opposition to the array substrate,
    wherein, a black matrix is provided on the color filter substrate, and the black matrix on the color filter substrate is disposed at least in a region opposed to a region between a display zone of a pixel unit of the array substrate and a black matrix of the array substrate.

* * * * *